(12) United States Patent
Satou et al.

(10) Patent No.: US 6,512,270 B2
(45) Date of Patent: Jan. 28, 2003

(54) THIN FILM TRANSISTOR SUBSTRATE AND PROCESS FOR PRODUCING THE SAME

(75) Inventors: Takeshi Satou, Kokubunji (JP); Takuya Takahashi, Hitachi (JP); Tomoya Katou, Hitachi (JP); Toshiki Kaneko, Chiba (JP); Hajime Ikeda, Mobara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/931,761

(22) Filed: Aug. 20, 2001

(65) Prior Publication Data

US 2002/0125533 A1 Sep. 12, 2002

(30) Foreign Application Priority Data

Mar. 9, 2001 (JP) ........................ 2001-065913

(51) Int. Cl.[7] .............................................. H01L 27/01
(52) U.S. Cl. ...................................................... 257/347
(58) Field of Search ................................. 257/347, 348

(56) References Cited

U.S. PATENT DOCUMENTS 6,081,308 A * 6/2000 Jeong et al. .................. 257/59
6,380,007 B1 * 4/2002 Koyama ...................... 438/151

FOREIGN PATENT DOCUMENTS

| JP | 5-152325 | 6/1993 |
|---|---|---|
| JP | 9-17996 | 1/1997 |
| JP | 10-240150 | 9/1998 |
| JP | 10-247733 | 9/1998 |
| JP | 11-163366 | 6/1999 |
| JP | 2001-168346 | 6/2001 |

* cited by examiner

*Primary Examiner*—Allan R. Wilson
(74) *Attorney, Agent, or Firm*—Antonelli, Terry, Stout, & Kraus, LLP

(57) ABSTRACT

A polycrystalline Si thin film transistor substrate having a self-aligned LDD and provided with a gate made of a Mo—W alloy having a W concentration not lower than 5% by weight and lower than 25% by weight and preferably a W concentration of 17 to 22% by weight, which is formed by a process comprising a wet-etching step using an etching solution having a phosphoric acid concentration of 60% to 70% by weight, has uniform characteristic properties and is excellent in productivity.

3 Claims, 7 Drawing Sheets

THIN FILM TRANSISTOR SUBSTRATE AND PROCESS FOR PRODUCING THE SAME

BACKGROUND OF THE INVENTION

The present invention relates to a thin film transistor substrate for use in active matrix liquid crystal display devices or self-emission type display devices such as organic light emitting devices and the like, and especially a thin film transistor substrate using the low temperature polycrystalline Si technique, and a process for producing the same.

In liquid crystal displays, not only the pixel switches but also circuits are formed on a substrate by using thin film transistors using a polycrystalline Si film which can be formed at a low temperature not higher than the heat-resistant temperature of glass, in order to reduce the number of parts and lower the cost. In the thin film transistor using a polycrystalline Si film and especially in the N type thin film transistor, it is usual to provide areas of LDD (lightly doped drain) between the source and the drain and gate, in order to improve the reliability. As a method for forming LDD without positional deviation from the gate, JP-A-5-152325 has disclosed a process of side-etching the electrically conductive film constituting the gate to form the gate into a shape retrograding from the resist, and forming an LDD on the semiconductor film provided under the retrograding region in a self-aligned manner with the gate.

In a liquid crystal display, the electrically conductive film constituting the gate is simultaneously used as a scan signal line, too, and therefore it is required to have a low resistivity enough to decrease the retardation in the transmission of signal via the line. Since the liquid crystal display using a thin film transistor using polycrystalline Si as a semiconductor film is exposed to a high temperature at the time of activating the dopant, the gate is simultaneously required to be resistant to heat. In JP-A-11-163366, there has been disclosed an example in which the gate is formed of molybdenum (Mo) and a molybdenum-tungsten (W) alloy (hereinafter, simply referred to as Mo—W alloy) having a low resistance and a high heat resistance and the LDD is formed in a self-aligned manner by a process including resist ashing.

In the gate processing of thin film transistor composed of Mo—W alloy, a dry etching method or a wet etching method can be used, among which wet etching method is advantageous from the viewpoint of productivity because a higher etching rate can be adopted in the wet etching method. However, in the wet etching of Mo alloy, a passivation film can be formed on the film surface depending on the conditions of etching, such as stirring condition, and thereby the etching rate can vary, as mentioned in JP-A-10-247733. Accordingly, in the production process of side-etching a Mo—W film by the wet-etching method and thereby forming LDD in a self-aligned manner in the sites retrograding from the resist, there has been a problem that reflection of the variation in the etching rate brings about an unevenness in the length of side-etching and further the length of LDD, due to which the characteristic properties of thin film transistors become uneven and the product yield decreases.

SUMMARY OF THE INVENTION

It is an object of the present invention to provide a thin film transistor substrate high in productivity and exhibiting uniform characteristic properties, and to a process for producing the same.

The present invention provides a thin film transistor substrate comprising coplanar type thin film transistors on a transparent insulating substrate, said thin film transistor having a semiconductor film made of crystalline silicon, a gate insulator film formed on the semiconductor film, a gate made of a metallic film and formed on the gate insulator film, a source and a drain both prepared by doping the semiconductor film and placed so as to hold the gate between them, LDD regions which are doped with a dopant of the same type as used for the source and drain at a lower concentration than in the source and drain being formed at the edges of the gate, wherein said gate is made of a mono-layered metallic film composed mainly of Mo and containing W in an amount not smaller than 5% by weight and smaller than 25% by weight.

The present invention further provides a process for producing the above-mentioned thin film transistor substrate which comprises a step of processing a gate with an etching solution containing phosphoric acid in an amount not smaller than 60% by weight and not larger than 70% by weight.

DETAILED DESCRIPTION OF THE INVENTION

The present inventors have studied the wet-etching method of Mo—W alloys. As a result, it has been found that the variation in the side etching length of Mo—W alloy can be reduced by etching a film of a Mo—W alloy of which W concentration is in the range of from 5% by weight to 25% by weight and preferably from 17% by weight to 22% by weight with an etching solution of which phosphoric acid concentration is not lower than 60% by weight and not higher than 70% by weight.

Accordingly, the first characteristic feature of the present invention consists in that, for solving the above-mentioned problem, a Mo—W alloy having a W concentration of from 5% by weight to 25% by weight is used as the gate.

The second characteristic feature of the present invention consists in using a Mo—W alloy having a W concentration of not lower than 17% by weight and not higher than 22% by weight as the gate.

The third characteristic feature of the present invention consists in a process comprising a step for processing an electrically conductive film made of a Mo—W film having a W concentration of from 5% by weight to 25% by weight with an etching solution having a phosphoric acid concentration not lower than 60% by weight and not higher than 70% by weight and thereby forming said electrically conductive film into a gate.

The above-mentioned characteristic features and other characteristic features of the present invention will be explained by referring to the following examples. Needless to say, the present invention is by no means limited by these examples.

EXAMPLE 1

Figure 1:
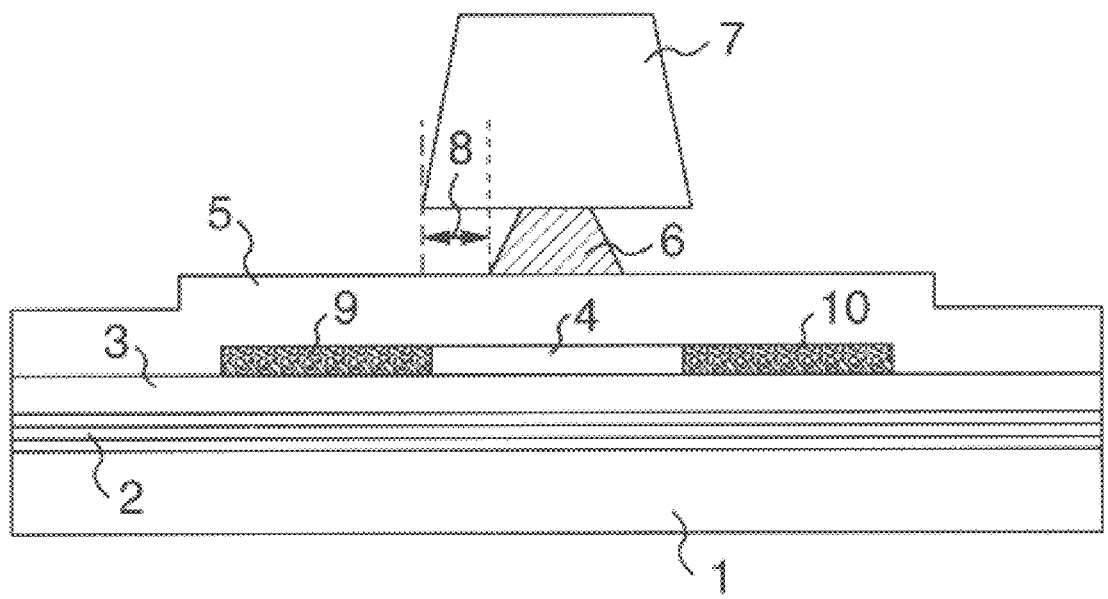
FIG. 1 is a sectional view illustrating the first example of the process for producing a thin film transistor substrate according to the present invention.
Figure 2:
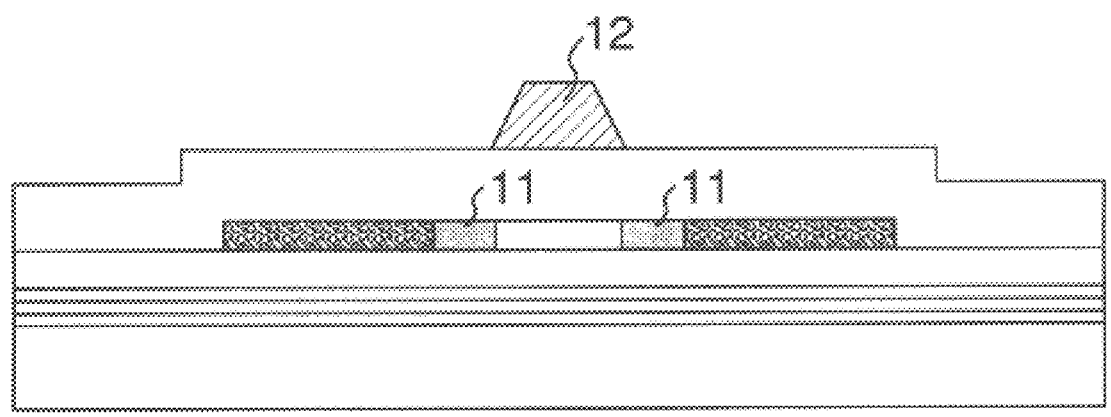
FIG. 2 is a sectional view illustrating the first example of the process for producing a thin film transistor substrate according to the present invention.

FIG. 1 and FIG. 2 illustrate the first example of the process for producing a thin film transistor substrate according to an embodiment of the present invention. Thus, a polycrystalline Si film 4 is formed on a glass substrate 1, which is a transparent insulator substrate, through intermediation of an undercoat (SiN) 2 and an undercoat ($SiO_2$) 3 both provided for blocking the impurities released from the glass substrate. The polycrystalline Si film is formed by first forming an amorphous Si film by means of plasma CVD, followed by an annealing process by a dehydrogenating treatment at 400° C. or below and crystallization by pulse excimer laser annealing.

Figure 9:
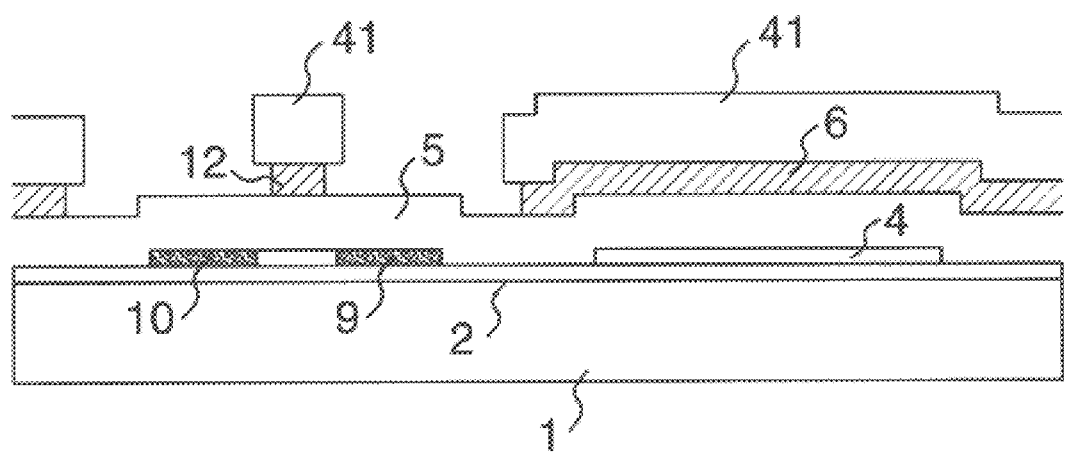
FIG. 9 is a sectional view illustrating the third example of the process for producing a thin film transistor substrate according to the present invention.
Figure 10:
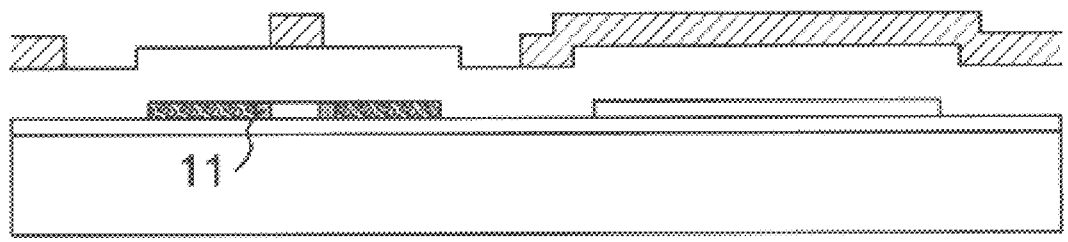
FIG. 10 is a sectional view illustrating the third example of the process for producing a thin film transistor substrate according to the present invention.

After processing the polycrystalline Si film into an island-like form by photolithography, $SiO_2$ film functioning as gate insulating film 5 is deposited by plasma CVD method using TEOS (tetraethoxysilane). Then, an electrically conductive film 6 made of Mo—W alloy is deposited up to a thickness of 150 nm by sputtering using a target made of Mo—W alloy. As the Mo—W alloy, that having a W concentration of 20% by weight is used. Then, a positive resist is coated and patterned by photolithography to form resist 7 as shown in FIG. 1. The conductive film 6 made of Mo—W alloy is wet-etched with an etching solution containing 65% by weight of phosphoric acid to form the gate made of conductive film 6 into a shape retrograding from the position of resist 7. The side etching length 8 is adjusted to 1 $\mu$m by controlling the etching time. Using the resist 7 as a mask, phosphorus ions are implanted through the gate insulating film into the polycrystalline Si film 4 at a dosage of $1 \times 10^{15}$ per $cm^2$. After removing the resist, phosphorus ions of lower concentration are implanted at a dosage of $1 \times 10^{13}$ per $cm^2$ as shown in FIG. 2. Thus, an LDD area 11 doped with a lower concentration of phosphorus is formed in a self-aligned manner with the gate 12 in the area where the gate is in a retrograding position from the resist as seen in FIG. 1. By carrying out a thermal annealing at 600° C. or below or by RTA (rapid thermal annealing) to activate the implanted phosphorus, there is obtained an N-type thin film transistor having an LDD formed in a self-aligned manner with the gate. In FIGS. 1, 9 and 10 express a drain and a source, respectively.

Apart from the case of FIGS. 1 and 2 where is formed an N-type thin film transistor, it is also possible to form a P-type thin film transistor with an LDD formed in a self-aligned manner by using boron in place of the phosphorus as the implanted ion. By forming LDD, the reliability can be improved in the P-type thin film transistor, too, similarly to the case of N-type thin film transistor, and the off current can be reduced. Since P-type thin film transistor is higher than N-type thin film transistor in the reliability to current drive, P-type is suitable for use in the current-drive type displays such as light emitting devices using an organic film, etc.

Since it is also possible to process the Mo—W alloy used as a gate in the process for producing the thin film transistor of the present invention by a dry etching method, the LDD can be formed not only by the above-mentioned method of utilizing the side etching by the wet etching method but also by other methods such as a method of forming LDD by dry etching by utilizing the shrinkage of resist pattern caused by ashing, etc.

Figure 3:
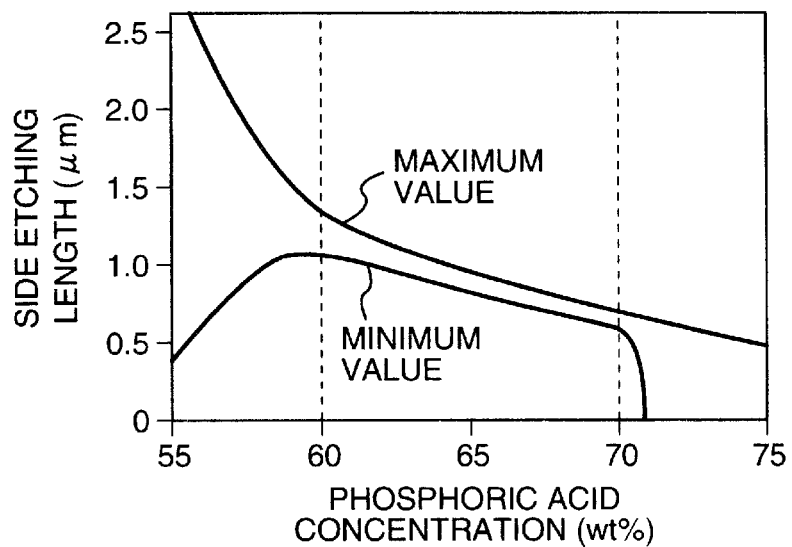
FIG. 3 is a graph illustrating an example of the dependence of the side etching length of Mo—W alloy film on the composition of etching solution.

FIG. 3 illustrates an example of the dependence of the side etching length of Mo—W alloy film having a W concentration of 20% by weight (approximately 12 atomic %) from the resist on the phosphoric acid concentration in the etching solution. In this example, an etching solution prepared by adding nitric acid, acetic acid and water to phosphoric acid is used, and the phosphoric acid concentration is controlled by changing the phosphoric acid/water ratio. The time period of etching is fixed at a constant value throughout all the etching runs. As a result, the side etching length varies depending on phosphoric acid concentration, and the maximum length of side etching decreases as the quantity of phosphoric acid increases. The side etching length generally shows a distribution within one treated substrate surface. The width of distribution is as follows. Thus, at a phosphoric acid concentration of 55% by weight, the side etching length ranges from a minimum value of 0.5 $\mu$m to a maximum value of 2.5 $\mu$m or more; at a phosphoric acid concentration of 65% by weight, the side etching length ranges from a minimum value of 0.8 $\mu$m to a maximum value of 0.9 $\mu$m; and at a phosphoric acid concentration of 75% by weight, the side etching length ranges from 0 $\mu$m to 0.5 $\mu$m. As shown in FIG. 3, when etching solutions having a phosphoric acid concentration of 60% by weight or less or 70% by weight or more are used, the side etching length shows a broader distribution. It is considered that in etching solutions having a phosphoric acid concentration of 60% by weight or less, the decrease in the quantity of phosphoric acid facilitates the formation of passivation film on the Mo alloy surface, due to which an area of low etching rate appears to bring about a broadened distribution in the side etching length. On the other hand, it is also considered that etching solutions having a phosphoric acid concentration of 70% by weight or more have a high viscosity, which makes it difficult to supply an etching solution onto the substrate uniformly, due to which the time period of etching becomes uneven on one substrate and the distribution of the side etching length increases. Accordingly, in order to carry out an etching treatment giving a small in-plane distribution of the side etching length, it is preferable to adopt a phosphoric acid concentration not lower than 60% by weight and not higher than 70% by weight. By carrying out the processing by the use of an etching solution of which phosphoric acid concentration falls in the range of from 60% by weight to 70% by weight, the side etching length and hence the LDD length of thin film transistor can be made uniform and the characteristic properties of thin film transistor can be improved. In the example shown in FIG. 3, an etching solution having a phosphoric acid concentration of 65% by weight is used, so that the accuracy of the side etching length within one substrate is ±10% or less. In the example shown in FIG. 3, the film has a W concentration of 20% by weight. However, even if the W concentration in film is different from that in the above case, there can be observed the same tendency as in the above case in that the side etching length is uniform so far as an etching solution having a phosphoric acid concentration falling in the range of 60 to 70% by weight is used for the processing, and the distribution of the side etching length broadens so far as an etching solution having a phosphoric acid concentration of 60% by weight or less or 70% by weight or more is used; even though the absolute value of the side etching length in the latter cases may be different from that in the case of FIG. 3.

Figure 4:
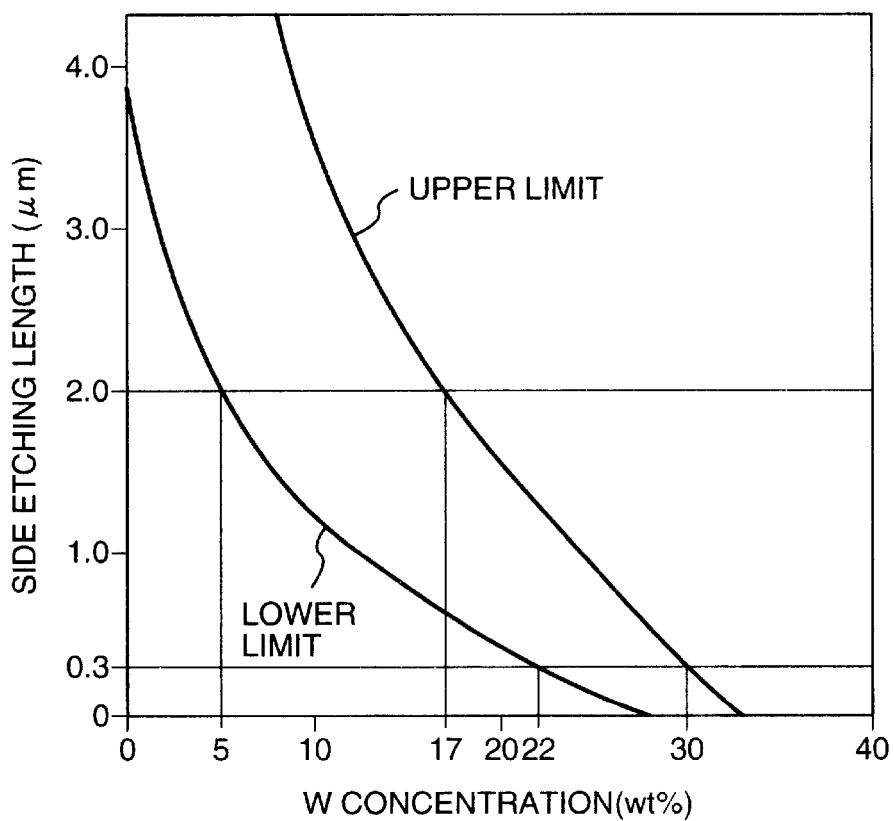
FIG. 4 is a graph illustrating an example of the dependence of the side etching length of Mo—W alloy film on the film composition.

It is possible to control the side etching length not only by changing the phosphoric acid concentration but also by changing the etching time. However, a prolonged etching time causes a decrease in productivity. Further, general etching apparatuses of manufacturing scale have a lower limit of etching time from the viewpoint of designing the apparatus, and an etching time shorter than the lower limit cannot be adopted. Accordingly, it is desired to carry out the etching for an adequate period of time. FIG. 4 shows an example of the dependence of the side etching length which can be formed at an etching time preferable from the viewpoint of manufacture on the composition of Mo—W alloy film. In this case, the film thickness of Mo—W alloy film is fixed at 150 nm, and the etching solutions used herein had a phosphoric acid concentration ranging from 60% by weight to 70% by weight where a uniform side etching length can be obtained. A Mo—W film having a W concentration of 5% by weight or less shows too high an etching rate, and no side etching length of 2 μm or less can be realized within the etching time range adoptable for the apparatus. On the other hand, an increase in W concentration brings about a decrease in etching rate, and at the same time a narrower range of the side etching length. At a W concentration of 17% by weight and 22% by weight, the length of side etching formable was in the range of from 0.6 to 2 μm and from 0.3 to 1.3 μm, respectively. When the Mo—W alloy film has a W concentration of 30% or more, the etching rate is too low, so that the side etching length achievable at the maximum etching time adoptable is 0.3 μm or less.

When LDD length of a thin film transistor is 2 μm or more, the on-current of the transistor decreases to ½ or less due to the resistance added by LDD, as compared with the case where no LDD is present. When LDD length is shorter than 0.3 μm, the electric field relaxation at the terminal of gate is insufficient, due to which breakdown voltage of thin film transistor decreases and the off-current increases. Accordingly, it is preferable to adjust the LDD length so as to fall in the range of 0.3 μm to 2 μm. By using a Mo—W alloy film having a W concentration of 5% by weight more and less than 30% by weight as a gate and carrying out the processing with an etching solution containing 60 to 70% by weight of phosphoric acid, there can be realized a side etching length suitable for use as an LDD. In the actual manufacturing processes, however, the conditions such as composition of etching solution may vary. It has been found that, in Mo—W films having a W concentration of 25% by weight or more, a repeated etching treatment brings about a decrease in etching rate, until the side etching length can become 0.3 μm or less even if the etching treatment is carried out for the maximum etching time allowable for the viewpoint of manufacture. Accordingly, the W concentration in the Mo—W film used as a gate is preferably lower than 25% by weight. So far as a Mo—W film having a W concentration not lower than 5% by weight and lower than 25% by weight is used as a gate, a side etching length of 0.3 μm to 2 μm suitably usable as LDD can be obtained stably, and a thin film transistor substrate on which thin film transistors of good characteristic properties are formed can be manufactured in a good productivity.

When a Mo—W alloy having a W concentration of 17% by weight to 22% by weight is subjected to an etching treatment with an etching solution having a phosphoric acid concentration of 60% by weight to 70% by weight for a period of time adequate from the viewpoint of manufacture, the side etching length cannot be shorter than 0.3 μm and longer than 2 μm. Accordingly, the margin of etching conditions on the side etching length is wide and the etching conditions can be preset with a great degree of freedom. Thus, the controllability of side etching length can be improved, and a thin film transistor on which thin film transistors of good characteristic properties are uniformly formed can be manufactured in a high yield and a high stability. Accordingly, Mo—W alloys having a W concentration of 17% by weight to 22% by weight are more suitable for use as a gate of thin film transistors provided with a self-aligned LDD.

EXAMPLE 2

Figure 5:
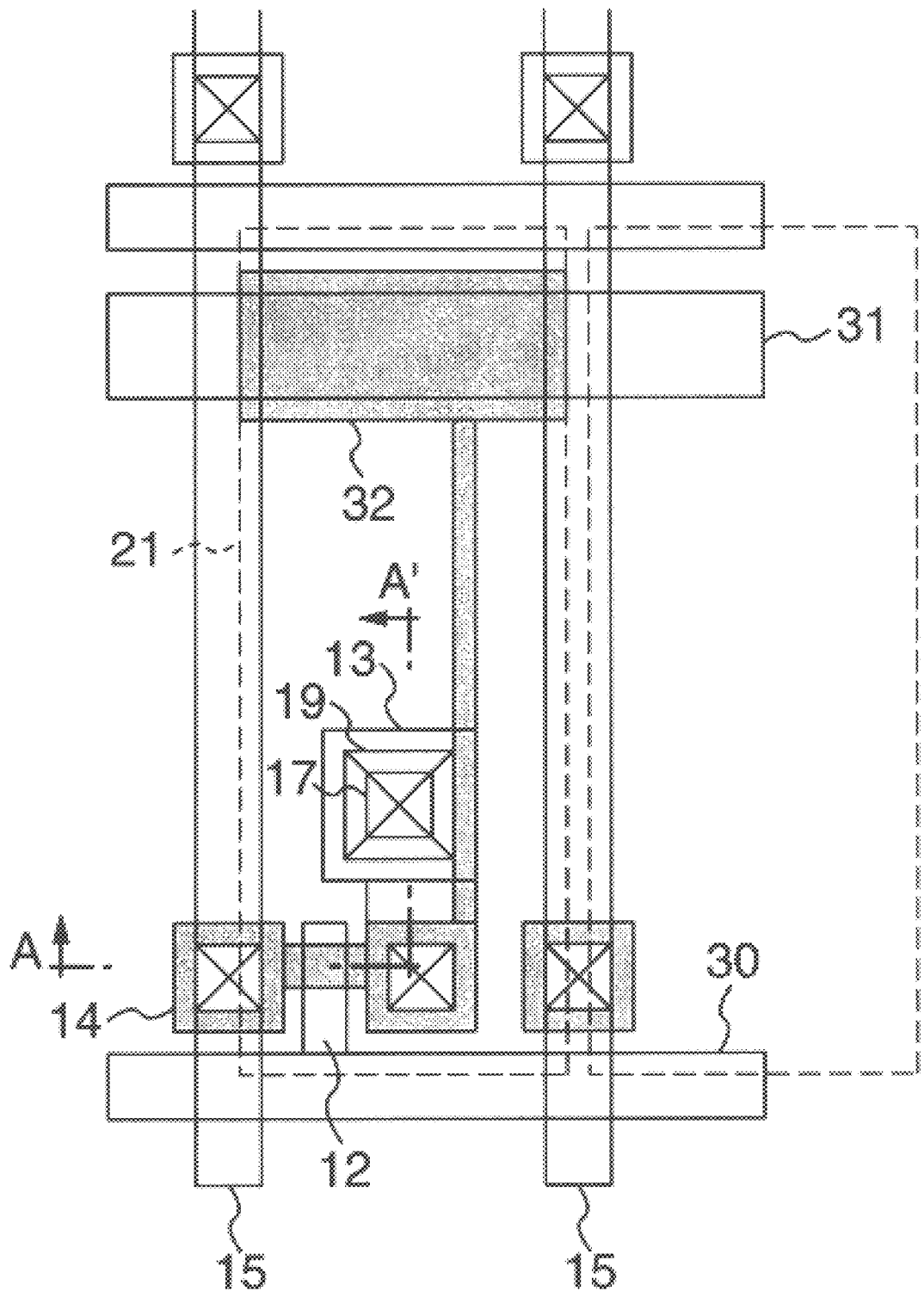
FIG. 5 is a drawing illustrating the second example of a thin film transistor substrate according to the present invention.
Figure 6:
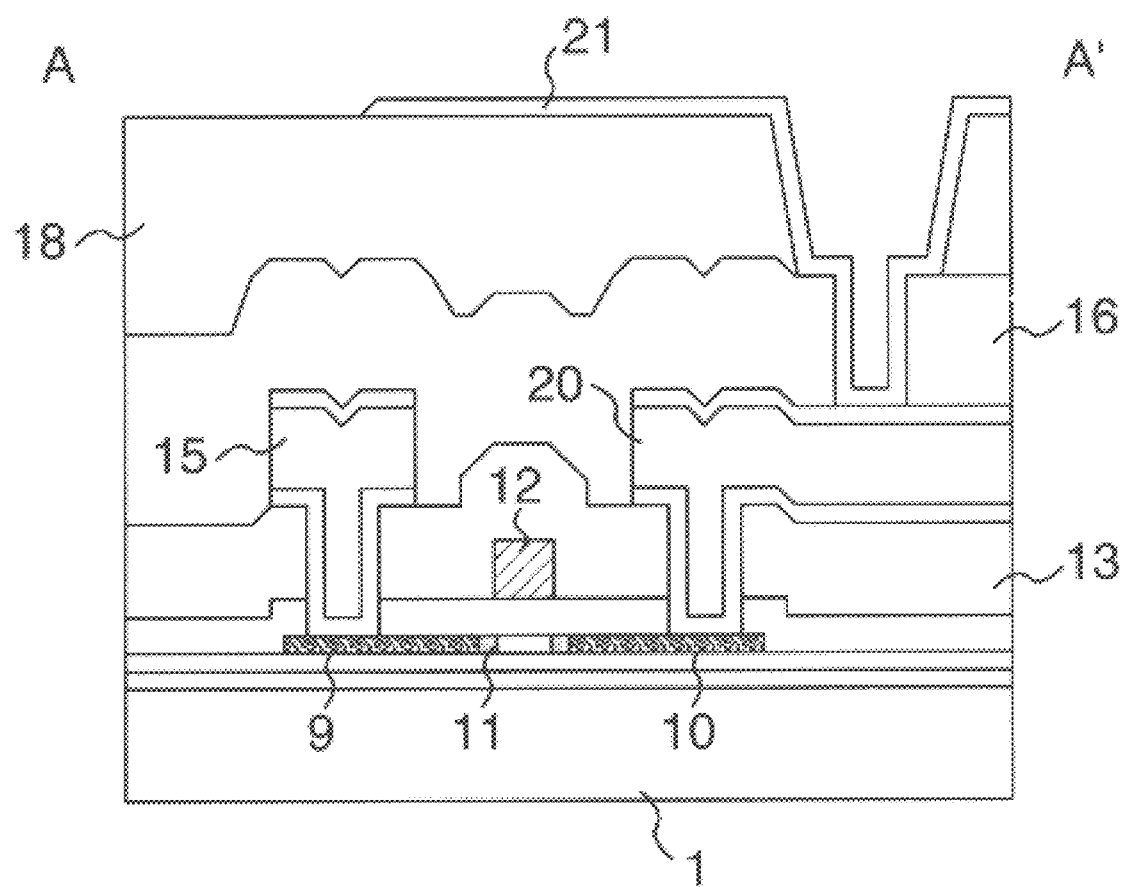
FIG. 6 is a sectional view illustrating the second example of a thin film transistor substrate according to the present invention.

FIG. 5 illustrates an example of pixel in a liquid crystal display using a thin film transistor substrate according to the second example of the present invention, and FIG. 6 illustrates a section thereof at the line A–A'. A thin film transistor gate 12, a gate line 30 and a common electrode line 31 are formed from a Mo—W alloy containing 5% by weight (approximately 3 atomic %) of W. The thin film transistor gate 12, gate line 30 and common electrode line 31 are subjected to an etching treatment using an etching solution containing 70% by weight of phosphoric acid, and an LDD 11 having a length of 2 μm is formed at the end of the gate 12 in a self-aligned manner.

On the gate, an interlayer insulating film 13 made of $SiO_2$ is formed by plasma CVD method using TEOS, and contact hole 14 is provided in the interlayer insulator film. A thin film transistor is connected to drain line 15 made of Ti/Al— Si alloy/Ti laminate film through the contact hole. Further, a transparent electrode 21 made of ITO (indium-tin-oxide) is formed and connected to source electrode 20 via a passivation (SiN) film 16 and an organic protecting film 18 made of a polyimide or acrylic transparent resin, via throughholes 17 and 19. The common electrode line 31 is made of a conductive film constituting the same layer as the gate. A storage capacitor 32 maintaining the voltage applied to the liquid crystal (not shown in the Figure) is formed between the common electrode line and the polycrystalline film via the gate insulator film. The transparent electrode is electrically connected to the storage capacitor. In FIG. 6, reference numbers 1, 9, 10 and 11 are the same as those in FIGS. 1 and 2.

If the technique of aluminum wet etching is used for the processing of drain line 15 made of Al alloy-containing laminate film, permeation of the etching solution for aluminum through defective parts of the interlayer insulating film can take place to etch the gate and the lines existing in the same layer as the gate, due to which breakage of the lines can occur. The breakage of the underlayer gate line can be prevented by dry-etching the aluminum alloy-containing laminated film with a chlorinated gas. As the transparent electrode, not only ITO but also IZO (indium-zinc oxides) can be used, both of which can be deposited by a sputtering method using an oxide target and processed by photolithography such as wet etching method using an organic acid. A Mo—Cr alloy or a Mo—Zr alloy or an alloy prepared by adding at least two elements selected from Cr, Zr and W to Mo can also be used in place of the Mo—W alloy, and in such cases the formation of passivation film on the Mo alloy surface can be suppressed and a uniform etching can be achieved by using an etching solution containing 60% by weight to 70% by weight of phosphoric acid. By using an etching solution having a phosphoric acid concentration of 60–70% by weight and thereby controlling the quantities of the elements added to Mo so as to give an adequate side etching length, a thin film transistor substrate on which LDD is formed uniformly can be obtained in a high yield.

EXAMPLE 3

Figure 7:
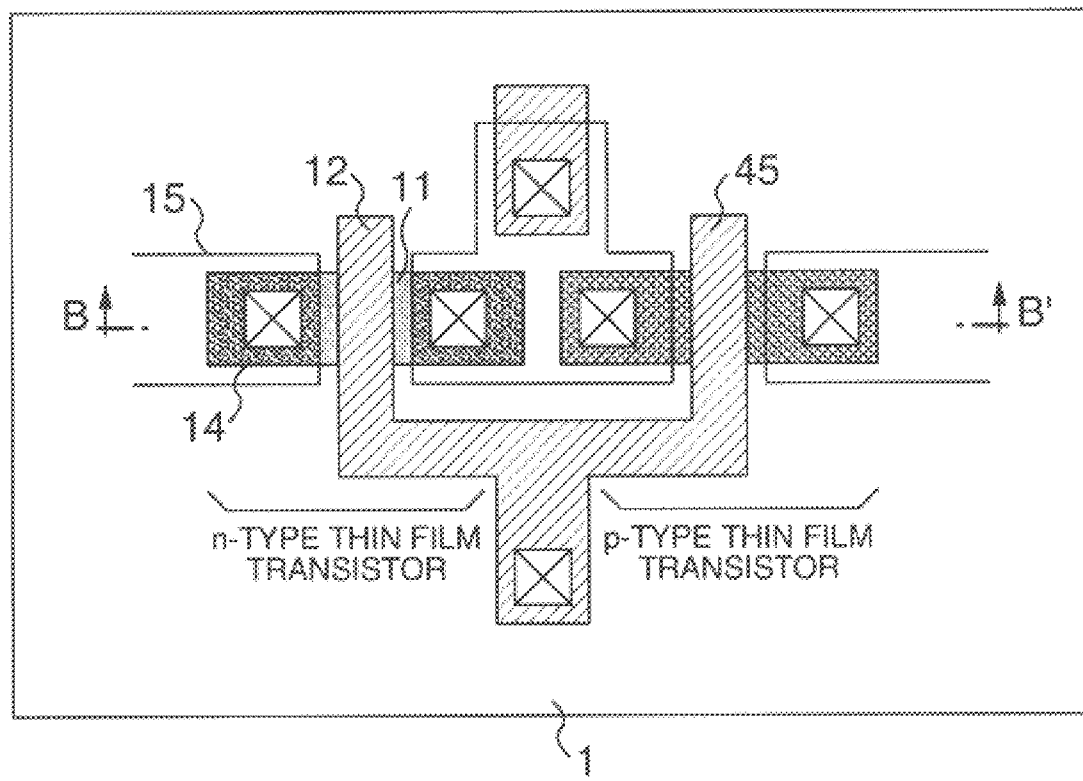
FIG. 7 is a drawing illustrating the third example of the process for producing a thin film transistor substrate according to the present invention.
Figure 8:
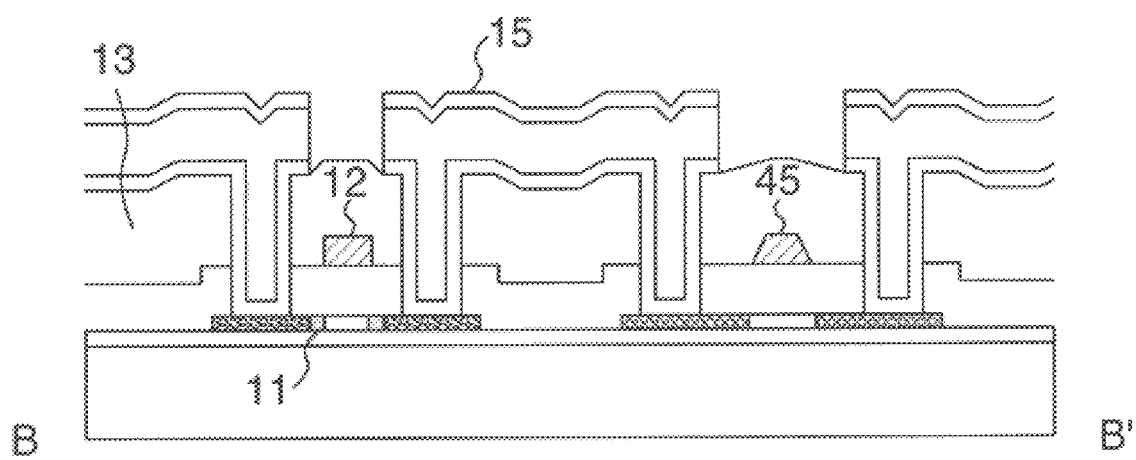
FIG. 8 is a sectional view illustrating the third example of the process for producing a thin film transistor substrate according to the present invention.

FIG. 7 illustrates the third example of the thin film transistor substrate according to the present invention, and FIG. 8 illustrates a sectional view thereof at the line B–B'. An N-type thin film transistor and a P-type thin film transistor are formed on a glass substrate 1 which is a transparent insulator substrate, and connected through drain line 15 made of Mo/Al—Si/Mo laminate film. The gates 12 and 45 of the thin film transistor are formed of a Mo—W alloy having a W concentration of 24% by weight (approximately 14 atomic %). On the terminal part of the gate 12 of the N-type thin film transistor, an LDD is formed in a self-aligned manner with the gate. In FIG. 7, 14 is contact hole; and in FIG. 8, 13 is an interlayer insulator film.

Figure 11:
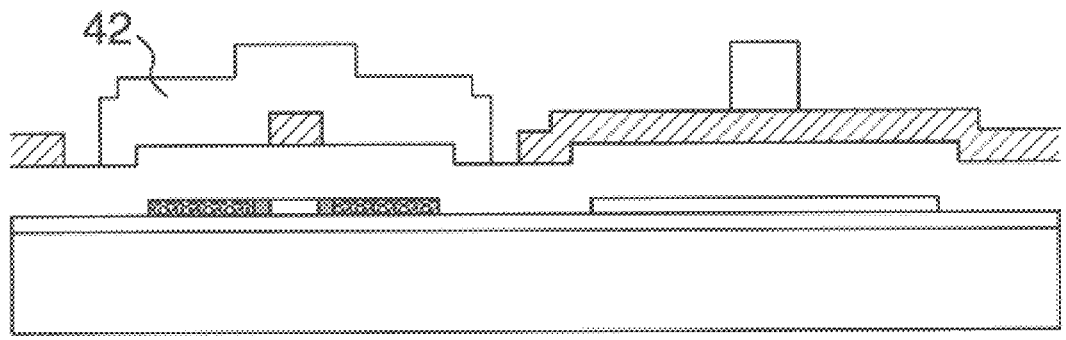
FIG. 11 is a sectional view illustrating the third example of the process for producing a thin film transistor substrate according to the present invention.
Figure 12:
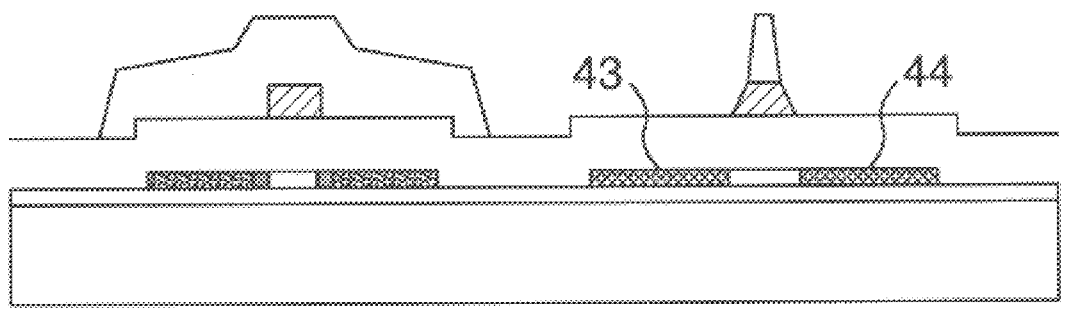
FIG. 12 is a sectional view illustrating the third example of the process for producing a thin film transistor substrate according to the present invention.
Figure 13:
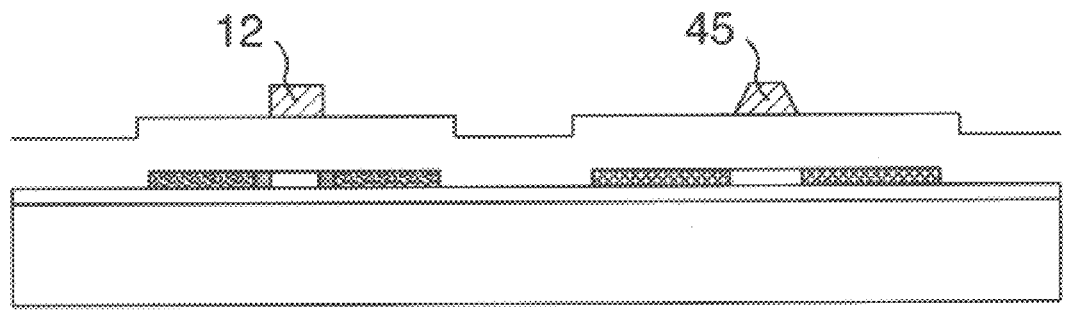
FIG. 13 is a sectional view illustrating the third example of the process for producing a thin film transistor substrate according to the present invention.

FIG. 9 through FIG. 13 illustrate an example of the process for producing the thin film transistor of FIG. 8. On a transparent insulator substrate 1, undercoat films 2 and 3, a polycrystalline Si film 4 and gate insulator film 5 are successively formed, and thereon is deposited an electrically conductive film 6 made of a Mo—W alloy containing 24% by weight of W by sputtering method. Subsequently, as shown in FIG. 9, a resist pattern 41 with openings corresponding to the source area and drain area of the N-type thin film transistor is formed, and then the conductive film 6 made of Mo—W alloy is wet-etched with an etching solution having a phosphoric acid concentration of 60% by weight to process the conductive film 6 into a shape 0.3 $\mu$m retrograding from the resist pattern 41. Subsequently, using the resist pattern 41 as a mask, phosphorus ions are implanted into the polycrystalline Si film at a dosage of $1 \times 10^{15}$ per cm$^2$ to dope the source and drain of the N-type thin film transistor. Then, as shown in FIG. 10, the resist pattern is removed, and a low concentration of phosphorus ions are implanted at a dosage of $3 \times 10^{12}$ per cm$^2$ to form LDD 11. Subsequently, as shown in FIG. 11, resist pattern 42 covering the region of N-type thin film transistor and having openings corresponding to the source and drain regions of the P-type thin film transistor are formed. As shown in FIG. 12, a dry etching is carried out by the use of a fluorinated gas such as NF$_3$, SF$_6$, CF$_4$ or the like to which oxygen is added to process the gate of P-type thin film transistor while shrinking the resist and to form openings in the Mo—W film on the source and drain regions. Further, boron ions are implanted at a dosage of $3 \times 10^{15}$ per cm$^2$ to dope the drain 43 and source 44 of the P-type thin film transistor. After removing the resist, thermal annealing or RTA is carried out and the implanted dopant is activated to form N-type and P-type of thin film transistors on one substrate as shown in FIG. 13. Further, in the same manner as in Example 2, lines 46 constituted of an interlayer insulator film and an aluminum alloy laminate film are formed to obtain the thin film transistor substrate of FIG. 8. In FIG. 9, the reference numbers 9, 10 and 12 are the same as in FIG. 6.

If the method of wet etching is used in the processing of gate of the P-type thin film transistor of the present invention, the gate is formed in a shape retrograding from the resist, and no boron is implanted into the polycrystalline Si covered with the resist in the retrograding region of gate, and a high resistivity region is formed, due to which characteristic properties of the P-type thin film transistor become worse. Since it is also process the Mo—W film having the composition usable for the gate of the thin film transistor of the present invention by dry etching method, the gate of P-type thin film transistor can be processed by dry etching while shrinking the resist as shown in FIG. 12, whereby the formation of the boron implantation-free region at the edges of the gate can be prevented and a P-type thin film transistor of good characteristic properties can be formed. According to this example, a CMOS type thin film transistor substrate excellent in uniformity and reliability in which N-type and P-type thin film transistors are formed on one substrate can be produced in a high productivity, and a liquid crystal display device having CMOS drivers of low power consumption on a substrate can be provided at a low cost.

As has been mentioned above, according to the present invention, a thin film transistor substrate excellent in productivity and exhibiting uniform characteristic properties can be provided. Further, according to the present invention, a thin film transistor substrate suitable for use in a liquid crystal display device including a built-in driver or a light emitting display device can be produced at a low cost.

What is claimed is:

1. A thin film transistor substrate comprising coplanar type thin film transistors on a transparent insulating substrate, said thin film transistor having a semiconductor film made of crystalline silicon, a gate insulator film formed on the semiconductor film, a gate made of a metallic film and formed on the gate insulator film, a source and a drain both formed by doping the semiconductor film so as to hold the gate therebetween, LDD regions formed at the edge of the gate by doping the semiconductor film with the same type of dopant as used for the source and drain at a lower concentration than in the source and drain, wherein said gate is constituted by a monolayer metallic film made mainly of Mo and containing W in an amount not smaller than 5% by weight and smaller than 25% by weight.

2. A thin film transistor substrate comprising coplanar type thin film transistors on a transparent insulating substrate, said thin film transistor having a semiconductor film made of crystalline silicon, a gate insulator film formed on the semiconductor film, a gate made of a metallic film and formed on the gate insulator film, a source and a drain both formed by doping the semiconductor film so as to hold the gate therebetween, LDD regions formed at the edge of the gate by doping the semiconductor film with the same type of dopant as used for the source and drain at a lower concentration than in the source and drain, wherein said gate is constituted by a monolayer metallic film made mainly of Mo and containing W in an amount not smaller than 17% by weight and not larger than 22% by weight.

3. A process for forming and producing a thin film transistor substrate according to claim 1 or claim 2, which comprises a step of processing gates by the use of an etching solution containing phosphoric acid in an amount not smaller than 60% by weight and not larger than 70% by weight.

* * * * *